(12) United States Patent
Enomoto et al.

(10) Patent No.: US 9,431,314 B2
(45) Date of Patent: Aug. 30, 2016

(54) THERMOSETTING RESIN COMPOSITION FOR SEALING PACKING OF SEMICONDUCTOR, AND SEMICONDUCTOR DEVICE

(75) Inventors: Tetsuya Enomoto, Tsukuba (JP); Emi Miyazawa, Tsukuba (JP); Kazutaka Honda, Tsukuba (JP); Akira Nagai, Tsukuba (JP); Keisuke Ookubo, Tsukuba (JP)

(73) Assignee: Hitachi Chemical Company, LTD, Tokyo (JP)

( * ) Notice: Subject to any disclaimer, the term of this patent is extended or adjusted under 35 U.S.C. 154(b) by 463 days.

(21) Appl. No.: 13/040,079

(22) Filed: Mar. 3, 2011

(65) Prior Publication Data

US 2012/0101191 A1    Apr. 26, 2012

(30) Foreign Application Priority Data

Oct. 21, 2010    (JP) ................ P2010-236592

(51) Int. Cl.
| | |
|---|---|
| C08L 63/00 | (2006.01) |
| H01L 21/56 | (2006.01) |
| H01L 23/29 | (2006.01) |
| C08G 59/42 | (2006.01) |
| C08G 59/62 | (2006.01) |

(52) U.S. Cl.
CPC ............ *H01L 23/295* (2013.01); *C08G 59/42* (2013.01); *C08G 59/621* (2013.01); *C08L 63/00* (2013.01); *H01L 21/563* (2013.01); *H01L 2224/16225* (2013.01); *H01L 2224/32225* (2013.01); *H01L 2224/73204* (2013.01); *H01L 2924/01322* (2013.01); *H01L 2924/09701* (2013.01); *H01L 2924/10253* (2013.01); *H01L 2924/15311* (2013.01)

(58) Field of Classification Search
CPC ............................... C08L 63/00; H01L 21/563
USPC .................................... 523/440, 400
See application file for complete search history.

(56) References Cited

U.S. PATENT DOCUMENTS

| | | | | |
|---|---|---|---|---|
| 4,632,798 | A * | 12/1986 | Eickman et al. | 264/272.17 |
| 4,719,250 | A * | 1/1988 | Eickman et al. | 523/212 |
| 4,720,424 | A * | 1/1988 | Eickman et al. | 428/323 |
| 7,327,039 | B2 * | 2/2008 | Charles et al. | 257/778 |

(Continued)

FOREIGN PATENT DOCUMENTS

| | | |
|---|---|---|
| CN | 1656862 A | 8/2005 |
| CN | 1687229 A | 10/2005 |

(Continued)

OTHER PUBLICATIONS

"Introduction of Denka Black", Denki Kagaku Kogyo KK, accessed 2014.*

(Continued)

*Primary Examiner* — Liam J Heincer
(74) *Attorney, Agent, or Firm* — Fitch, Even, Tabin & Flannery LLP

(57) ABSTRACT

A thermosetting resin composition for an underfilling of a semiconductor comprising, as essential components, a thermosetting resin, a curing agent, a flux agent and two or more inorganic fillers with different mean particle sizes, wherein the inorganic fillers include an inorganic filler with a mean particle size of no greater than 100 nm and an inorganic filler with a mean particle size of greater than 100 nm.

7 Claims, 4 Drawing Sheets

(56) References Cited

U.S. PATENT DOCUMENTS

| | | | |
|---|---|---|---|
| 2003/0131937 A1* | 7/2003 | Konarski | 156/330 |
| 2006/0199301 A1* | 9/2006 | Basheer | B82Y 30/00 438/106 |
| 2006/0272747 A1 | 12/2006 | Wang et al. | |
| 2007/0261883 A1* | 11/2007 | Chan et al. | 174/259 |
| 2008/0099727 A1* | 5/2008 | Sakano et al. | 252/301.4 H |
| 2008/0314618 A1* | 12/2008 | Shimoosako et al. | 174/250 |
| 2010/0025709 A1* | 2/2010 | Koseki et al. | 257/98 |
| 2011/0083890 A1* | 4/2011 | Tanaka | C08G 59/4014 174/258 |
| 2011/0098420 A1* | 4/2011 | Takizawa et al. | 525/477 |
| 2011/0241228 A1* | 10/2011 | Enomoto et al. | 257/793 |
| 2011/0267673 A1* | 11/2011 | Agrawal et al. | 359/267 |
| 2011/0284907 A1* | 11/2011 | Nakamura et al. | 257/98 |
| 2012/0025245 A1* | 2/2012 | Nakamura et al. | 257/98 |

FOREIGN PATENT DOCUMENTS

| | | |
|---|---|---|
| CN | 101223206 A | 7/2008 |
| CN | 101522812 A | 9/2009 |
| EP | 1895581 A2 | 3/2008 |
| JP | 2000-038516 A | 2/2000 |
| JP | 2000-186214 | 7/2000 |
| JP | 2001-175829 A | 6/2001 |
| JP | 2002-261202 A | 9/2002 |
| JP | 2003-138100 A | 5/2003 |
| JP | 2005-307169 A | 11/2005 |
| JP | 2005-320368 A | 12/2005 |
| JP | 2006-036915 A | 2/2006 |
| JP | 2007-504684 T | 3/2007 |
| JP | 2008-294382 A | 12/2008 |
| JP | 2009-024099 A | 2/2009 |
| JP | 2009-135308 A | 6/2009 |
| JP | 2009-167385 A | 7/2009 |
| JP | 2009-263611 A | 11/2009 |
| JP | 2009-298961 A | 12/2009 |
| JP | 2010-177679 A | 8/2010 |
| KR | 10-2010-0105756 A | 9/2010 |
| WO | WO 03/075339 A1 | 9/2003 |
| WO | WO 2009/081874 A1 | 7/2009 |
| WO | WO 2011/040064 A1 | 4/2011 |
| WO | WO 2012156173 A1 * | 11/2012 |

OTHER PUBLICATIONS

Machine translation of JP 2009-024099, 2014.*
Ciba Specialty Chemicals (TACTIX 556, Araldite EPN 1138 SP, EPN 1179 and Hardener HT 976, 1998).*
Ciba Specialty Chemicals (TACTIX 742 and TACTIX 123 (Resins) and Hardener HT 976, 1998).*

* cited by examiner

THERMOSETTING RESIN COMPOSITION FOR SEALING PACKING OF SEMICONDUCTOR, AND SEMICONDUCTOR DEVICE

BACKGROUND OF THE INVENTION

1. Field of the Invention

The present invention relates to a thermosetting resin composition for an underfilling of a semiconductor, and to a semiconductor device produced using it.

2. Related Background Art

With ongoing trends toward smaller and higher performance electronic devices in recent years, semiconductor devices that are smaller, thinner and have improved electrical characteristics (such as applicability for high-frequency transmission) are in demand. A simultaneous shift has begun from systems in which semiconductor chips are mounted on boards by conventional wire bonding, to flip-chip connection systems in which conductive protruding electrodes known as a "bumps" are formed on semiconductor chips for direct connection with board electrodes.

The bumps formed on semiconductor chips include bumps composed of solder or gold, but recent years have seen increasing use of bumps that have structures with solder layers or tin layers formed on the tips of copper bumps or copper pillars, for suitability to formation of microconnections.

Connections using metal joints are also desired in order to achieve higher reliability, and such methods are being employed not only with solder joints using solder bumps, or metal joints formed by bumps having structures with solder layers or tin layers formed on the tips of copper pillars, but also when using copper bumps or gold bumps, by forming solder layers or tin layers on the board electrode side and creating metal joints.

In flip-chip connection systems as well, since thermal stress created by the difference in thermal expansion coefficients of the semiconductor chips and board can potentially be concentrated at the joints and damage the joints, it is necessary to underfill the gap between the semiconductor chips and board with a resin, in order to disperse the thermal stress and increase the connection reliability. Generally speaking, underfilling with a resin is accomplished using a system in which the semiconductor chips and board are connected with solder or the like, and then the liquid sealing resin is injected into the gap by capillary flow.

For connection between chips and a board, it is common to use flux composed of a rosin or organic acid, to allow removal of the oxide layer on the solder surface by reductive reaction to facilitate metal melting. If flux residue remains in such cases, it can cause generation of air bubbles known as voids when the liquid resin is injected, or corrosion of wiring can occur due to the acid component, thus lowering the connection reliability, and therefore a step of residue cleaning has been required. However, it is often difficult to accomplish cleaning of flux residue because of the narrower gap between the semiconductor chips and board when the connection pitch becomes smaller. In addition, productivity may be reduced because it takes a longer time to inject the liquid sealing resin into the narrower gap between the semiconductor chips and board.

In order to overcome these problems with the liquid sealing resin, there have been proposed connecting methods known as "pre-applied systems" in which a sealing resin having a property allowing removal of the solder surface oxide layer (flux activity) by reductive reaction is applied to the board, and then the gap between the semiconductor chips and board are underfilled with the resin as the semiconductor chips and board are connected, thus allowing cleaning of the flux residue to be skipped, and underfilling resins suitable for such connection systems have been developed (see Patent documents 1-3, for example).

With the goal of shortening the connection process, there is increased interest in wafer processes wherein an underfilling resin layer is formed on the bump-formed side of the semiconductor wafer, which is then individuated into semiconductor chips, thereby creating a plurality of resin layer-formed chips, and the semiconductor chips are connected with a board, and underfilling resins suited for such processes are also being actively developed (see Patent documents 4-6, for example).

Patent Documents

[Patent document 1] Japanese Unexamined Patent Application Publication No. 2003-138100
[Patent document 2] Japanese Unexamined Patent Application Publication No. 2005-320368
[Patent document 3] Japanese Unexamined Patent Application Publication No. 2009-24099
[Patent document 4] Japanese Patent Public Inspection No. 2007-504684
[Patent document 5] Japanese Unexamined Patent Application Publication No. 2008-294382
[Patent document 6] Japanese Unexamined Patent Application Publication No. 2009-135308

SUMMARY OF THE INVENTION

Incidentally, with the shift toward lead-free products in recent years, the use of lead-free solder such as Sn—Ag—Cu instead of the conventional eutectic solder is becoming more common, and semiconductor device mounting temperature is rising from 240° C. to 260° C. Demands are therefore also increasing for higher reliability of underfilling resins under high temperatures, and even greater adhesive force, particularly under high temperatures, is desired.

It is therefore an object of the present invention to provide a thermosetting resin composition for an underfilling of a semiconductor, that has excellent connection reliability even under high temperatures, i.e. sufficient adhesive force even under high temperatures, and that allows underfilling of semiconductors in a satisfactory connected state.

The invention provides a thermosetting resin composition for an underfilling of a semiconductor comprising, as essential components, a thermosetting resin, a curing agent, a flux agent and two or more inorganic fillers with different mean particle sizes, wherein the inorganic fillers include an inorganic filler with a mean particle size of no greater than 100 nm and an inorganic filler with a mean particle size of greater than 100 nm. The mean particle size referred to here may be measured as the median diameter using a particle size distribution analyzer based on laser light diffraction.

According to this thermosetting resin composition for an underfilling of a semiconductor, it is possible to underfill semiconductors with sufficient adhesive force even under high temperatures, and with a satisfactory connected state.

The thermosetting resin composition for an underfilling of a semiconductor is preferably formed into a film, from the viewpoint of improved workability.

The thermosetting resin composition for an underfilling of a semiconductor also preferably has a 250° C. viscosity of no greater than 100 Pa·s, from the viewpoint of exhibiting a higher level of the effect of the invention.

The thermosetting resin composition for an underfilling of a semiconductor preferably has a transmittance of at least 10% for light with a wavelength of 555 nm. In order for the thermosetting resin composition for an underfilling of a semiconductor to be suitable for the wafer process described above, it is necessary to recognize the pattern shape or alignment marks on the semiconductor wafer surface through the underfilling resin layer during dicing or alignment process, and this can be easily accomplished if the transmittance for light with a wavelength of 555 nm is within this range.

The present invention further relates to a semiconductor device produced using the thermosetting resin composition for an underfilling of a semiconductor described above.

Such a semiconductor device has excellent connection reliability because it employs a thermosetting resin composition for an underfilling of a semiconductor.

According to the invention it is possible to provide a thermosetting resin composition for an underfilling of a semiconductor, which allows underfilling of a semiconductor with sufficient adhesive force and with a satisfactory connected state even under high temperatures, as well as a semiconductor device using it.

DESCRIPTION OF THE PREFERRED EMBODIMENTS

Figure 1:
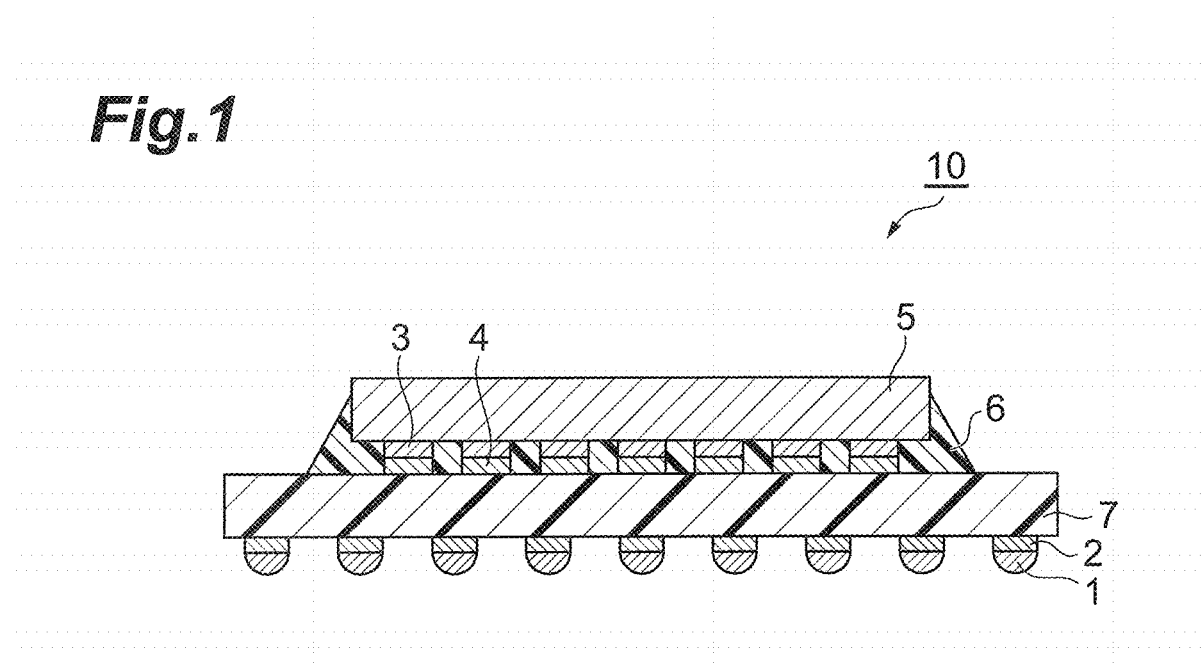
FIG. 1 is a cross-sectional view showing an example of a semiconductor device produced using a thermosetting resin composition of the invention.

The thermosetting resin composition for an underfilling of a semiconductor (hereunder also referred to simply as "thermosetting resin composition") of the invention comprises as essential components a thermosetting resin, a curing agent, a flux agent and at least two different inorganic fillers with different mean particle sizes.

Thermosetting resins include phenol resins, cyanate resins, benzocyclobutene resins, acrylate resins, methacrylate resins and epoxy resins, with epoxy resins being particularly preferred from the viewpoint of heat resistance and manageability.

The epoxy resin is not particularly restricted so long as it is bifunctional or greater, and for example, there may be used bisphenol A-type epoxy resins, bisphenol F-type epoxy resins, bisphenol S-type epoxy resins, phenol-novolac-type epoxy resins, cresol-novolac-type epoxy resins, biphenyl-type epoxy resins, hydroquinone-type epoxy resins, diphenyl sulfide skeleton-containing epoxy resins, phenolaralkyl-type polyfunctional epoxy resins, naphthalene skeleton-containing polyfunctional epoxy resins, dicyclopentadiene skeleton-containing polyfunctional epoxy resins, triphenyl-methane skeleton-containing polyfunctional epoxy resins, aminophenol-type epoxy resins, diaminodiphenylmethane-type epoxy resins, and various other types of polyfunctional epoxy resins. Preferably used among these, from the viewpoint of viscosity reduction, low water absorption and high heat resistance, are bisphenol A-type epoxy resins, bisphenol F-type epoxy resins, naphthalene skeleton-containing polyfunctional epoxy resins, dicyclopentadiene skeleton-containing polyfunctional epoxy resins and triphenylmethane skeleton-containing polyfunctional epoxy resins. These epoxy resins may be in the form of liquids or solids at 25° C. These epoxy resins may also be used alone or in combinations of two or more.

Examples of thermosetting resin curing agents include imidazoles, acid anhydrides, amines, phenols, hydrazides, polymercaptanes, Lewis acid-amine complexes, organic peroxides and photoacid generators. These may also be used as epoxy resin curing agents, and preferred among them are imidazoles, acid anhydrides, amines and phenols, from the viewpoint of viscosity reduction, storage stability and cured heat resistance.

Examples of imidazoles include 2MZ, C11Z, 2PZ, 2E4MZ, 2P4 MZ, 1B2MZ, 1B2PZ, 2MZ-CN, 2E4MZ-CN, 2PZ-CN, C11Z-CN, 2PZ-CNS, C11Z-CNS, 2MZ-A, C11Z-A, 2E4MZ-A, 2P4 MHZ, 2PHZ, 2MA-OK, 2PZ-OK (product names of Shikoku Chemicals Corp.), and these imidazoles with epoxy resins added. From the viewpoint of extending the storage stability, these curing agents are preferably used in a microencapsulated form by coating with a polyurethane-based or polyester-based macromolecular compound. Any of these may be used alone or in mixtures of two or more.

The amount of such imidazoles is preferably 0.1-10 wt %, more preferably 0.5-10 wt % and even more preferably 1-10 wt %, with respect to the epoxy resin. Sufficient curing may not be achieved at lower than 0.1 wt %, while at greater than 10 wt % the storage stability may be reduced and the gelation time may become too short.

As examples of acid anhydrides there may be mentioned maleic anhydride, succinic anhydride, dodecenylsuccinic anhydride, phthalic anhydride, tetrahydrophthalic anhydride, methyltetrahydrophthalic anhydride, hexahydrophthalic anhydride, methylhexahydrophthalic anhydride, endomethylenetetrahydrophthalic acid, methylendomethylenetetrahydrophthalic acid, methylhymic anhydride, pyromellitic dianhydride, benzophenonetetracarboxylic dianhydride, polyazelaic anhydride, alkylstyrene-maleic anhydride copolymer, 3,4-dimethyl-6-(2-methyl-1-propenyl)-4-cyclohexene-1,2-dicarboxylic anhydride, 1-isopropyl-4-methyl-bicyclo[2.2.2]oct-5-ene-2,3-dicarboxylic anhydride, ethyleneglycol bistrimellitate and glycerol trisanhydrotrimellitate. Particularly preferred among these from the viewpoint of heat resistance and humidity resistance are methyltetrahydrophthalic anhydride, methylhexahydrophthalic anhydride, endomethylenetetrahydrophthalic acid, methylendomethylenetetrahydrophthalic acid, 3,4-dimethyl-6-(2-methyl-1-propenyl)-4-cyclohexene-1,2-dicarboxylic anhydride, 1-isopropyl-4-methyl-bicyclo[2.2.2]oct-5-ene-2,3-dicarboxylic anhydride, ethyleneglycol bistrimellitate and glycerol trisanhydrotrimellitate. Any of these may be used alone or in mixtures of two or more.

The amount of acid anhydride added is preferably 0.5-1.5 and more preferably 0.7-1.2, as the ratio of the number of epoxy groups and the number of carboxylic acid groups generated from acid anhydride groups (number of epoxy groups/number of carboxylic acid groups). If this ratio is smaller than 0.5, excessive carboxylic acid groups will remain and the insulating reliability may be reduced compared to when it is within the specified range, while if it is larger than 1.5, the curing may not proceed sufficiently.

An amine is not particularly restricted so long as it is a compound having at least one primary or secondary amino groups in the molecule, but aromatic amines are preferred from the viewpoint of storage stability and cured heat resistance. Examples of aromatic amines include diaminodiphenylmethane, diaminodiphenylsulfone, diaminodiphenyl sulfide, metaxylenediamine, 3,3'-diethyl-4,4'-diaminodiphenylmethane, 3,3',5,5'-tetraethyl-4,4'-diaminodiphenylmethane, 4,4'-diaminodiphenylsulfone, 4,4'-diaminodiphenyl sulfide, 2,2-bis-[4-(4-aminophenoxy)phenyl]-hexafluoropropane, 2,2-bis(4-aminophenyl)-hexafluoropropane, 2,4-diaminotoluene, 1,4-diaminobenzene, 1,3-diaminobenzene, diethyltoluenediamine, dimethyltoluenediamine, anilines, alkylated anilines and N-alkylated anilines. Any of these may be used alone or in mixtures of two or more.

The amount of amine added is preferably an amount such that the ratio of the number of epoxy groups and the number of active hydrogens (number of epoxy groups/number of active hydrogens) is 0.5-1.5 and more preferably 0.7-1.2. If the ratio is smaller than 0.5, excessive amines will remain, potentially lowering the moisture-proof reliability, and if it is greater than 1.5 the curing may not proceed sufficiently.

As phenols there may be used bisphenol resins, phenol-novolac resins, naphthol-novolac resins, allylated phenol-novolac resins, biphenol resins, cresol-novolac resins, phenolaralkyl resins, cresol-naphthol-formaldehyde polycondensates, triphenylmethane-type polyfunctional phenol resins, xylylene-modified phenol-novolac resins, xylylene-modified naphthol-novolac resins, and various polyfunctional phenol resins. Any of the above may be used alone, or two or more thereof may be used in admixture.

The amount of phenol added is preferably an amount such that the ratio of the number of epoxy groups and the number of phenolic hydroxyl groups (number of epoxy groups/number of phenolic hydroxyl groups) is 0.5-1.5 and more preferably 0.7-1.2. If the ratio is smaller than 0.5, excessive phenols will remain, potentially lowering the moisture-proof reliability, and if it is greater than 1.5 the curing may not proceed sufficiently.

When an acid anhydride, amine or phenol is used as a curing agent, a curing accelerator is preferably used therewith. Curing accelerators to be used include imidazoles, as well as tertiary amines, cyclic amines such as 1,8-diazabicyclo(5.4.0)undecene-7 and 1,5-diazabicyclo(4.3.0)nonene-5, as well as tetraphenylborate salts thereof, trialkylphosphines such as tributylphosphine, triarylphosphines such as triphenylphosphine, and quaternary phosphonium salts such as tetraphenylphosphonium tetraphenylborate and tetra(n-butyl)phosphonium tetraphenylborate. The content is appropriately set in consideration of the gelation time or storage stability.

The flux agent used is preferably at least one compound selected from among alcohols, phenols and carboxylic acids.

An alcohol to be used is not particularly restricted so long as it is a compound having at least two alcoholic hydroxyl groups in the molecule, and examples include 1,3-dioxane-5,5-dimethanol, 1,5-pentanediol, 2,5-furanedimethanol, diethylene glycol, tetraethylene glycol, pentaethylene glycol, hexaethylene glycol, 1,2,3-hexanetriol, 1,2,4-butanetriol, 1,2,6-hexanetriol, 3-methylpentane-1,3,5-triol, glycerin, trimethylolethane, trimethylolpropane, erythritol, pentaerythritol, ribitol, sorbitol, 2,4-diethyl-1,5-pentanediol, propyleneglycol monomethyl ether, propyleneglycol monoethyl ether, 1,3-butylene glycol, 2-ethyl-1,3-hexanediol, N-butyldiethanolamine, N-ethyldiethanolamine, diethanolamine, triethanolamine, N,N-bis(2-hydroxyethyl)isopropanolamine, bis(2-hydroxymethyl)iminotris(hydroxymethyl)methane, N,N,N',N'-tetrakis(2-hydroxyethyl)ethylenediamine and 1,1',1'',1'''-(ethylenedinitrilo)tetrakis(2-propanol). Preferred among these are compounds with tertiary nitrogen atoms, such as N-butyldiethanolamine, N-ethyldiethanolamine, triethanolamine, N,N-bis(2-hydroxyethyl)isopropanolamine, bis(2-hydroxymethyl)iminotris(hydroxymethyl)methane, N,N,N',N'-tetrakis(2-hydroxyethyl)ethylenediamine and 1,1',1'',1'''-(ethylenedinitrilo)tetrakis(2-propanol), because they exhibit satisfactory flux activity compared to other compounds. While the exact reason for the satisfactory flux ability that is exhibited is not fully understood, it is conjectured to be due to the combined effects of the oxide layer reduction power of the alcoholic hydroxyl groups, and the electron-donating reduction power of the lone pair electrons on the tertiary nitrogen atom. These compounds may be used alone or in combinations of two or more.

A phenol to be used is not particularly restricted so long as it is a compound having at least two phenolic hydroxyl groups, and examples include catechol, resorcinol, hydroquinone, biphenol, dihydroxynaphthalene, hydroxyhydroquinone, pyrogallol, methylidenebiphenol (bisphenol F), isopropylidenebiphenol (bisphenol A), ethylidenebiphenol (bisphenol AD), 1,1,1-tris(4-hydroxyphenyl)ethane, trihydroxybenzophenone, trihydroxyacetophenone and poly-p-vinylphenol. As compounds with at least two phenolic hydroxyl groups there may be used polycondensates of one or more compounds selected from among compounds having at least one phenolic hydroxyl group in the molecule, and one or more compounds selected from among aromatic compounds having two halomethyl, alkoxymethyl or hydroxylmethyl groups in the molecule, divinylbenzenes and aldehydes. Examples of compounds having at least one phenolic hydroxyl group in the molecule include phenol, alkylphenols, naphthol, cresol, catechol, resorcinol, hydroquinone, biphenol, dihydroxynaphthalene, hydroxyhydroquinone, pyrogallol, methylidenebiphenol (bisphenol F), isopropylidenebiphenol (bisphenol A), ethylidenebiphenol (bisphenol AD), 1,1,1-tris(4-hydroxyphenyl)ethane, trihydroxybenzophenone, trihydroxyacetophenone and poly-p-vinylphenol. Examples of aromatic compounds having two halomethyl, alkoxymethyl or hydroxylmethyl groups in the molecule include 1,2-bis(chloromethyl)benzene, 1,3-bis(chloromethyl)benzene, 1,4-bis(chloromethyl)benzene, 1,2-bis(methoxymethyl)benzene, 1,3-bis(methoxymethyl)benzene, 1,4-bis(methoxymethyl)benzene, 1,2-bis(hydroxymethyl)benzene, 1,3-bis(hydroxymethyl)benzene, 1,4-bis(hydroxymethyl)benzene, bis(chloromethyl)biphenyl and bis(methoxymethyl)biphenyl. Examples of aldehydes include formaldehyde (or formalin in aqueous solution), paraformaldehyde, trioxane and hexamethylenetetramine. Examples of polycondensates include phenol-novolac resins, which are polycondensates of phenol and formaldehyde, cresol-novolac resins, which are polycondensates of cresol and formaldehyde, naphthol-novolac resins, which are polycondensates of naphthol and formaldehyde, phenolaralkyl resins, which are polycondensates of phenol and 1,4-bis(methoxymethyl)benzene, polycondensates of bisphenol A and formaldehyde, polycondensates of phenol and divinylbenzene and polycondensates of cresol, naphthol and formaldehyde, which polycondensates may be rubber-modified or may have an aminotriazine skeleton or dicyclopentadiene skeleton introduced into the molecular skeleton. Further included are such phenolic hydroxyl-containing compounds that have been liquefied by allylation, such as allylated phenol-novolac resins, diallylbisphenol A, diallylbisphenol F, diallylbiphenols and the like. These compounds may be used alone or in combinations of two or more.

Carboxylic acids include aliphatic carboxylic acids and aromatic carboxylic acids. Examples of aliphatic carboxylic acids include malonic acid, methylmalonic acid, dimethylmalonic acid, ethylmalonic acid, allylmalonic acid, 2,2'-thiodiacetic acid, 3,3'-thiodipropionic acid, 2,2'-(ethylenedithio)diacetic acid, 3,3'-dithiodipropionic acid, 2-ethyl-2-hydroxybutyric acid, dithiodiglycolic acid, diglycolic acid, acetylene dicarboxylic acid, maleic acid, malic acid, 2-isopropylmalic acid, tartaric acid, itaconic acid, 1,3-acetonedicarboxylic acid, tricarballylic acid, muconic acid, β-hydromuconic acid, succinic acid, methylsuccinic acid, dimethylsuccinic acid, glutaric acid, α-ketoglutaric acid, 2-methylglutaric acid, 3-methylglutaric acid, 2,2-dimethylglutaric acid, 3,3-dimethylglutaric acid, 2,2-bis(hydroxymethyl)propionic acid, citric acid, adipic acid, 3-tert-butyladipic acid, pimelic acid, phenyloxalic acid, phenylacetic acid, nitrophenylacetic acid, phenoxyacetic acid, nitrophenoxyacetic acid, phenylthioacetic acid, hydroxyphenylacetic acid, dihydroxyphenylacetic acid, mandelic acid, hydroxymandelic acid, dihydroxymandelic acid, 1,2,3,4-butanetetracarboxylic acid, suberic acid, 4,4'-dithiodibutyric acid, cinnamic acid, nitrocinnamic acid, hydroxycinnamic acid, dihydroxycinnamic acid, coumarinic acid phenylpyruvic acid, hydroxyphenylpyruvic acid, caffeic acid, homophthalic acid, tolylacetic acid, phenoxypropionic acid, hydroxyphenylpropionic acid, benzyloxyacetic acid, phenyllactic acid, tropic acid, 3-(phenylsulfonyl)propionic acid, 3,3-tetramethyleneglutaric acid, 5-oxoazelaic acid, azelaic acid, phenylsuccinic acid, 1,2-phenylenediacetic acid, 1,3-phenylenediacetic acid, 1,4-phenylenediacetic acid, benzylmalonic acid, sebacic acid, dodecanedioic acid, undecanedioic acid, diphenylacetic acid, benzilic acid, dicyclohexylacetic acid, tetradecane diacid, 2,2-diphenylpropionic acid, 3,3-diphenylpropionic acid, 4,4-bis(4-hydroxyphenyl)valeric acid, pimaric acid, palustric acid, isopimaric acid, abietic acid, dehydroabietic acid, neoabietic acid and agathic acid. Examples of aromatic carboxylic acids include benzoic acid, 2-hydroxybenzoic acid, 3-hydroxybenzoic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 2,3,4-trihydroxybenzoic acid, 2,4,6-trihydroxybenzoic acid, 3,4,5-trihydroxybenzoic acid, 1,2,3-benzenetricarboxylic acid, 1,2,4-benzenetricarboxylic acid, 1,3,5-benzenetricarboxylic acid, 2-[bis(4-hydroxyphenyl)methyl]benzoic acid, 1-naphthoic acid, 2-naphthoic acid, 1-hydroxy-2-naphthoic acid, 2-hydroxy-1-naphthoic acid, 3-hydroxy-2-naphthoic acid, 6-hydroxy-2-naphthoic acid, 1,4-dihydroxy-2-naphthoic acid, 3,5-dihydroxy-2-naphthoic acid, 3,7-dihydroxy-2-naphthoic acid, 2,3-naphthalenedicarboxylic acid, 2,6-naphthalenedicarboxylic acid, 2-phenoxybenzoic acid, biphenyl-4-carboxylic acid, biphenyl-2-carboxylic acid and 2-benzoylbenzoic acid. Preferred among these, from the viewpoint of storage stability and ready availability, are succinic acid, malic acid, itaconic acid, 2,2-bis(hydroxymethyl)propionic acid, adipic acid, 3,3'-thiodipropionic acid, 3,3'-dithiodipropionic acid, 1,2,3,4-butanetetracarboxylic acid, suberic acid, sebacic acid, phenylsuccinic acid, dodecanedioic acid, diphenylacetic acid, benzilic acid, 4,4-bis(4-hydroxyphenyl)valeric acid, abietic acid, 2,5-dihydroxybenzoic acid, 3,4,5-trihydroxybenzoic acid, 1,2,4-benzenetricarboxylic acid, 1,3,5-benzenetricarboxylic acid and 2-[bis(4-hydroxyphenyl)methyl]benzoic acid. These compounds may be used alone or in combinations of two or more.

These flux agents may be liquid or solid at room temperature, but from the viewpoint of storage stability it is preferred to use a compound that is solid at room temperature.

The flux agent content in the thermosetting resin composition may be, for example, 1-10 parts by weight with respect to 100 parts by weight of the thermosetting resin.

The inorganic filler comprises an inorganic filler with a mean particle size of no greater than 100 nm (preferably no greater than 75 nm) and an inorganic filler with a mean particle size of greater than 100 nm (preferably greater than 150 nm). The mean particle size referred to here is the median diameter as measured with a particle size distribution meter.

Examples of inorganic filler materials include glass, silicon dioxide (silica), aluminum oxide (alumina), silicon and aluminum complex oxide (mullite), titanium oxide (titania), silicon and titanium complex oxide, magnesium oxide, zirconium dioxide (zirconia), cerium oxide (ceria), carbon black, mica, barium sulfate and boron nitride. Particularly preferred among these are silica, alumina, mullite, silicon and titanium complex oxide, and boron nitride, from the viewpoint of impurities. They may be in a crushed form, spherical, scaly or needle-like, for example, but are preferably spherical from the viewpoint of dispersibility.

The inorganic filler may be non-surface-treated, or surface-treated with a silane coupling agent, but in order to improve the dispersibility, it is preferred to use a surface-treated inorganic filler with a mean particle size of up to 100 nm. Examples of functional groups that are introduced into the inorganic filler surface by surface treatment include alkyl, vinyl, acryl, methacryl, amino, ureido, phenyl, glycidyl, anilino, isocyanurate and styryl, among which alkyl, acryl, phenyl and glycidyl are preferred from the viewpoint of dispersibility. Examples of silane coupling agents to be used for surface treatment include vinyltrimethoxysilane, 3-mercaptopropyltrimethoxysilane, 3-acryloxypropyltrimethoxysilane, 3-methacryloxypropyltrimethoxysilane, 3-glycidoxypropyltrimethoxysilane, 3-glycidoxypropylmethyldimethoxysilane, 3-aminopropyltrimethoxysilane, 3-(2-aminoethyl)aminopropyltrimethoxysilane, 3-(2-aminoethyl)propylmethyldimethoxysilane, 3-anilinopropyltrimethoxysilane, 3-anilinopropyltrimethoxysilane, 3-ureidopropyltrimethoxysilane, methyltrimethoxysilane, dimethyldimethoxysilane, trimethylmethoxysilane, methyltriphenoxysilane, n-propyltrimethoxysilane, n-butyltrimethoxysilane, isobutyltrimethoxysilane, n-hexyltrimethoxysilane, cyclohexyltrimethoxysilane, n-octyltrimethoxysilane, n-decyltrimethoxysilane, 1,6-bis(trimethoxysilyl)hexane, phenyltrimethoxysilane, diphenyldimethoxysilane, p-styryltrimethoxysilane, 2-(3,4-epoxycyclohexyl)ethyltrimethoxysilane, N-phenyl-3-aminopropyltrimethoxysilane and 1,3,5-N-tris(trimethoxysilylpropyl)isocyanurate.

The inorganic filler content is preferably 30-80 wt %, more preferably 40-70 wt % and even more preferably 40-65 wt % of the total thermosetting resin composition. If the content is less than 30 wt %, the thermal expansion coefficient may be increased and the reliability reduced, while if it exceeds 80 wt % the viscosity of the thermosetting resin composition may be overly increased and the connection reliability lowered or, in the case of a film-like thermosetting resin composition, it may become fragile and difficult to handle it.

The content of an inorganic filler with a mean particle size of up to 100 nm is preferably 10-90 wt %, more preferably 20-90 wt % and even more preferably 30-90 wt % of the total inorganic filler. If it is less than 10 wt %, the effect of improved adhesive force may be reduced. If it exceeds 90 wt %, the viscosity of the thermosetting resin composition may be overly increased and the connection reliability lowered or, in the case of a film-like thermosetting resin composition, it may become fragile and difficult to handle it.

Also, in order to allow visibility of dicing lines, or alignment marks for alignment during connection, through the thermosetting resin composition layer, the content of an inorganic filler with a mean particle size of up to 100 nm is preferably at least 45 wt % and more preferably at least 50 wt % of the total inorganic filler.

There is no particular restriction on the lower limit for the mean particle size of an inorganic filler with a mean particle size of up to 100 nm, but it is preferably no smaller than 10 nm in consideration of dispersibility and workability. The upper limit for the mean particle size of an inorganic filler with a mean particle size of larger than 100 nm is preferably 10 μm and more preferably 5 μm. If the mean particle size exceeds 10 μm, it may be larger than the gap between the semiconductor chips and board, and damage may occur in the semiconductor chip during connection of semiconductor chips.

The particle size distribution for an inorganic filler with a mean particle size of up to 100 nm may be 30-200 nm, for example, and the particle size distribution for an inorganic filler with a mean particle size of greater than 100 nm may be 100-2000 nm, for example.

Although the mechanism by which the adhesive force is improved by addition of an inorganic filler with a mean particle size of up to 100 nm is not fully understood, it is believed that when a filler with a small mean particle size of no greater than 100 nm is filled into the gaps between another inorganic filler, the filling density of the filler in the cured product is increased, and the area of contact between the thermosetting resin and inorganic filler is widened, thus being related to the bulk density of the cured product.

The thermosetting resin composition may further contain additives, such as a silane coupling agent, titanium coupling agent, antioxidant, leveling agent or ion trapping agent. These may be used alone or in combinations of two or more. Their contents may be adjusted as suitable to exhibit the effects of the additives.

The thermosetting resin composition may be either a paste or a film at room temperature, but from the viewpoint of workability it is preferably a film.

The thermosetting resin composition may comprise a thermoplastic resin for formation into a film. Examples of thermoplastic resins include phenoxy resins, polyimide resins, polyamide resins, polycarbodiimide resins, phenol resins, cyanate ester resins, acrylic resins, polyester resins, polyethylene resins, polyethersulfone resins, polyetherimide resins, polyvinylacetal resins, polyvinyl butyral resins, urethane resins, polyurethaneimide resins and acrylic rubber, among which phenoxy resins, polyimide resins, polyvinyl butyral resins, polyurethaneimide resins and acrylic rubber which have excellent heat resistance and film formability are preferred, and phenoxy resins and polyimide resins are more preferred. The weight-average molecular weight is preferably greater than 5000, more preferably 10,000 or greater and even more preferably 20,000 or greater. A weight-average molecular weight of 5000 or lower may result in reduced film formability. The weight-average molecular weight is the value measured by GPC (Gel Permeation Chromatography) based on polystyrene. These thermoplastic resins may be used alone or as mixtures or copolymers of two or more different types.

The thermoplastic resin content in the thermosetting resin composition may be, for example, 0-300 parts by weight with respect to 100 parts by weight of the thermosetting resin.

The viscosity of the thermosetting resin composition at 250° C. is preferably no higher than 100 Pa·s. If the viscosity is higher than 100 Pa·s, the connection reliability may be reduced. There are no particular restrictions on the lower limit for the 250° C. viscosity, but it is preferably 0.1 Pa·s or higher and more preferably 0.5 Pa·s or higher. If the viscosity is lower than 0.1 Pa·s, the thermosetting resin composition may crawl up the sides of the semiconductor chip when the semiconductor chip and board are connected, potentially adhering onto the connecting apparatus.

The gelation time of the thermosetting resin composition at 250° C. is preferably 1-30 s, more preferably 1-20 s and even more preferably 3-15 s. If it is shorter than 1 s the solder may cure before melting, potentially lowering the connection reliability, while if it is longer than 30 s the productivity may be reduced, resulting in insufficient curing and potentially lowering the connection reliability. The gelation time is the time until the thermosetting resin composition becomes unstirrable, when it is placed on a hot plate set to 250° C. and stirred with a spatula.

The mean linear expansion coefficient of the cured thermosetting resin composition at no higher than the glass transition temperature is preferably no greater than $60 \times 10^{-6}/°$ C., more preferably no greater than $55 \times 10^{-6}/°$ C. and even more preferably no greater than $50 \times 10^{-6}/°$ C. If the thermal expansion coefficient is greater than $60 \times 10^{-6}/°$ C., the stress generated by expansion and shrinkage of the resin in a thermal cycle test will increase, potentially lowering the connection reliability.

The thermosetting resin composition may be prepared by stirring and mixing the thermosetting resin, curing agent, flux agent, inorganic filler and other additives using a planetary mixer, kneader, bead mill, triple roll or the like.

For formation of a film, the thermoplastic resin, thermosetting resin, curing agent, flux agent, inorganic filler and other additives may be mixed in an organic solvent such as toluene, ethyl acetate, methyl ethyl ketone, cyclohexanone or N-methylpyrrolidone using a planetary mixer or bead mill to prepare a varnish, the varnish coated onto a release-treated film base using a knife coater or roll coater, and the organic solvent removed by drying.

The release-treated film base may be made of polyethylene terephthalate, polyurethane, polyvinyl chloride, polyvinyl acetate, polyvinyl butyral, a polyolefin, or the like.

When an inorganic filler is added, it may be used in the form of a powder, as a solvent-dispersed slurry, as a thermosetting resin- or curing agent-dispersed master batch or as a dispersion in a varnish comprising a thermosetting resin dissolved in a solvent. Particularly when an inorganic filler having a mean particle size of up to 100 nm is used, it is preferably used as a solvent-dispersed slurry, as a thermosetting resin- or curing agent-dispersed master batch or as a dispersion in a varnish comprising a thermosetting resin dissolved in a solvent, from the viewpoint of workability.

A thermosetting resin composition that is a paste at room temperature may be applied to a semiconductor chip or board by dispensing or printing, while a thermosetting resin composition that is a film at room temperature may be applied by attachment of a piece cut to a prescribed size onto a semiconductor chip or board.

After the thermosetting resin composition layer has been formed on the bump-formed side of the semiconductor wafer, it may be individuated into semiconductor chips, so that the thermosetting resin composition is applied to the bump-formed side of the semiconductor chips. This method is expected to increase productivity since it allows fabrication of multiple thermosetting resin composition-applied semiconductor chips at one time.

The method of forming the thermosetting resin composition layer on the bump-formed side of the semiconductor wafer may be a method of coating a paste by spin coating or printing or a method of laminating a film, but a method of laminating a film is preferred from the viewpoint of workability. A hot roll laminator or vacuum laminator may be used for lamination of the film-like thermosetting resin composition onto the bump-formed side of the semiconductor wafer.

When the thermosetting resin composition layer has been formed on the bump-formed side of a semiconductor wafer, the thermosetting resin composition must be optically transparent to allow dicing lines, or alignment marks used for alignment during connection, to be visible through the thermosetting resin composition layer, and it preferably exhibits at least 10% transmittance for visible light of 555 nm.

The semiconductor wafer having a thermosetting resin composition layer formed on the bump-formed side may be individuated into semiconductor chips by blade dicing, laser dicing, stealth dicing or the like. The semiconductor wafer having a thermosetting resin composition layer formed on the bump-formed side may be attached with the side of the semiconductor wafer opposite the bump-formed side attached to dicing tape for anchoring to a dicing apparatus, or it may be attached to dicing tape with the thermosetting resin composition layer contacting it, and then anchored to a dicing apparatus.

The semiconductor wafer used may be thinned beforehand to a prescribed thickness by backgrinding, or the thermosetting resin composition layer may be formed on the bump-formed side of the semiconductor wafer before backgrinding, backgrind tape attached in contact with the thermosetting resin composition layer, and then backgrinding performed from the side opposite the bump-formed side for reduction of the semiconductor wafer to the prescribed thickness. Also, grooves may be formed by half-cutting with a dicing apparatus along dicing lines on the semiconductor wafer before backgrinding, and then the thermosetting resin composition layer formed on the bump-formed side, backgrind tape attached in contact with the thermosetting resin composition layer, and the grooves exposed by backgrinding from the side opposite the bump-formed side, to reduce the thickness of the semiconductor wafer while individuating the semiconductor chips.

The amount of thermosetting resin composition applied may be appropriately set depending on the size of the semiconductor chips and the volume of gap between the semiconductor chips and board. Particularly when the thermosetting resin composition is in the form of a film, the thickness is usually preferred to be 0.5-2.0 times, more preferably 0.6-1.8 times and even more preferably 0.7-1.7 times the bump heights before connection. If it is thinner than 0.5, voids may be generated by insufficient filling by the resin, or when the film-like thermosetting resin composition is attached to the bump-formed semiconductor wafer, air bubbles may remain at the bump peripheries where the bumps have not been completely embedded, potentially becoming voids during connection and lowering the connection reliability. If the thickness exceeds 2.0 times the bump heights, the thermosetting resin composition squeezed out from the chip joint areas during connection can potentially reach the semiconductor chip sides and adhere onto the connecting apparatus.

After the semiconductor chips and board have been aligned during connection between the semiconductor chips and board, they are pressed while heating at a temperature of at least the melting point of solder or tin, so that the solder or tin surface oxide layer is removed by the flux agent, while the solder or tin is rapidly melted and metal bonding is established between the bumps and board electrode.

The heating/pressing time is preferably 0.1-20 s, more preferably 0.1-15 s, and even more preferably 0.1-10 s. If it is shorter than 0.1 s, it will not be possible to thoroughly eliminate the resin from between the bumps and electrodes or remove the solder or tin surface oxide layer, thus potentially lowering the connection reliability. If the connection time exceeds 20 s, the productivity may be lowered.

The load during pressing of the semiconductor chips onto the board is appropriately set as the load necessary for elimination of the resin from between the bumps and board electrodes, depending on the area of the semiconductor chips and the number of bumps, but in order to avoid damage such as cracking in the semiconductor chips, the pressure on the semiconductor chip area is preferably no greater than 2 MPa, more preferably the pressure is no greater than 1.5 MPa, and even more preferably the pressure is no greater than 1 MPa. The pressure per bump is preferably no greater than 0.5 N, more preferably no greater than 0.2 N and even more preferably no greater than 0.1 N.

The connection may be accomplished using a first step in which the semiconductor chips are pressed against the board at a temperature above the active temperature of the flux agent in the thermosetting resin composition and lower than the melting point of solder or tin, and a second step in which heating is performed at or above the melting point of solder or tin while pressing, and the semiconductor chips and board are connected by metal bonding by the solder or tin.

The first step is for elimination of the resin from between the bumps and board electrodes while accomplishing reduction removal of the oxide layer on the solder or tin surface by the flux agent, and the heating temperature in the first step is set to a temperature at least high enough for the flux agent to exhibit flux ability, and lower than the melting point of solder or tin. By setting the temperature in this manner, it is possible for the resin that has been reduced in viscosity by heating, to be eliminated from between the bumps and board electrodes and situated in the thermosetting resin composition with the oxide layer removed from the solder or tin surface, thus allowing reoxidation to be prevented. However, because it has not reached a temperature at or above the melting point of solder or tin, it does not cause formation of a joint by metal bonding. When a flux agent that is solid at room temperature has been used it is necessary, in order to exhibit flux ability, for it to be converted to a liquid or low viscosity state at a temperature of at least its melting point or softening point, so that the surface of the solder or tin is evenly wetted, and therefore the lower limit for the heating temperature in the first step is the melting point or softening point of the solid flux agent. In addition, if the melting point or softening point of the solid flux agent is equal to or above the melting point of solder or tin, the oxide layer on the solder or tin surface will be removed while the solder or tin melts, and trappings may be created wherein the thermosetting resin composition or filler has become incorporated into the molten solder or tin, and therefore the melting point or softening point of the solid flux agent is preferably lower than the melting point of solder or tin. By carrying out the first step, the reaction between the epoxy resin and curing agent is partially initiated resulting in high molecularization of the low-molecular-weight components, so that it is possible to obtain an effect of inhibiting creation of voids by volatilization of the low-molecular-weight components under the high temperature connecting conditions in the second step.

The load during pressing of the semiconductor chips onto the board in the first step is appropriately set as the load necessary for elimination of the resin from between the bumps and board electrodes, depending on the area of the semiconductor chips and the number of bumps, but in order to avoid damage such as cracking in the semiconductor chips, the pressure on the semiconductor chip area is preferably no greater than 2 MPa, more preferably the pressure is no greater than 1.5 MPa, and even more preferably the pressure is no greater than 1 MPa. The pressure per bump is preferably no greater than 0.5 N, more preferably no greater than 0.2 N and even more preferably no greater than 0.1 N.

The heating time in the first step in most cases is preferably 0.1-20 s, more preferably 0.5-15 s and even more preferably 1.0-15 s. If the heating time is shorter than 0.1 s, the oxide layer on the solder or tin surface may not be evenly removed, or elimination of the resin from between the bumps and board electrodes may be insufficient, while if the heating time is longer than 20 s, the productivity may be reduced. Also, if the heating time is set to be at least as long as the gelation time of the thermosetting resin composition at the heating temperature in the first step, flow of the molten solder or tin will be inhibited by the gelled thermosetting resin composition in the second step and it may not be possible to accomplish thorough wettability, and therefore the heating time is preferably set as appropriate for the gelation time of the thermosetting resin composition used.

The object in the second step is to melt the solder or tin and accomplish metal bonding between the bumps and board electrodes, and the heating temperature is therefore set to a temperature of at least the melting point of solder or tin. Since removal of the oxide layer on the solder or tin surface and elimination of the resin from between the bumps and board electrodes are completed in the first step, the solder or tin rapidly melts and exhibits satisfactory wettability on the board electrodes or bump surfaces, thus allowing trapping to be inhibited.

The heating time in the second step is preferably 0.1-20 s, more preferably 0.5-15 s and even more preferably 1.0-15 s. If the heating time is shorter than 0.1 s, the solder or tin may not sufficiently wet the board electrodes or bump surfaces, potentially resulting in reduced connection reliability, while if it is greater than 20 s, the productivity may be lowered. By setting the heating time to be at least the gelation time of the thermosetting resin composition at the heating temperature in the second step, the gelled thermosetting resin composition will reinforce the joints by metal bonding, and in the cooling process after connection has been completed, it will be possible to achieve an effect of inhibiting joint defects such as cracking that are produced when thermal stress, generated by the difference in thermal expansion coefficients of the semiconductor chips and board, becomes concentrated at the joints formed by metal bonding, and therefore the heating time is preferably set as appropriate depending on the gelation time of the thermosetting resin composition.

Although the second step may be carried out without pressing the semiconductor chips and board, the semiconductor chips and board are preferably pressed together so as to avoid reduction in connection reliability due to lifting of the semiconductor chip by thermal expansion of the sealing resin. The load during pressing of the semiconductor chips onto the board in the second step is preferably a pressure of no greater than 2 MPa, more preferably a pressure of no greater than 1.5 MPa and even more preferably a pressure of no greater than 1 MPa on the semiconductor chip area, in order to avoid damage to the semiconductor chips, as in the first step. The pressure per bump is preferably no greater than 0.5 N, more preferably no greater than 0.2 N and even more preferably no greater than 0.1 N.

The first step and second step may be conducted in a continuous manner using a single connecting apparatus, but this will lengthen the operation time since the connecting apparatus must be heated and cooled, and may lower productivity in some cases. The first step and second step may alternatively be carried out separately in different connecting apparatuses, thus allowing operation with fixed preset temperatures for each of the connecting apparatuses, and allowing higher productivity. This can also simplify facility equipment, since the operation can be carried out with connecting apparatuses equipped with mechanisms for heating to a constant temperature (constant heat mechanisms), instead of a connecting apparatus equipped with both heating and cooling mechanisms (pulse heat mechanism).

Furthermore, instead of alignment the semiconductor chips and board in the first step, a step may be carried out before the first step, in which the semiconductor chips and board are positioned and the semiconductor chips temporarily anchored to the board at a temperature lower than the active temperature of the flux agent but at which the thermosetting resin composition exhibits adhesion. A temporary anchoring step will allow the first step and second step to be carried out at one time for multiple semiconductor chips and boards, so that high productivity can be achieved.

For removal of moisture or other residual volatile compounds in the thermosetting resin composition to prevent voids forming during connection, heat treatment may be performed after the thermosetting resin composition has been applied to the board or semiconductor chips. The heating temperature is preferably 80-120° C. and the heating time is preferably between 10 seconds and 30 minutes. If the heating temperature is lower than 80° C., a long time will be required for removal of the moisture or residual volatile content and productivity may be reduced, while if it is higher than 120° C., curing reaction of the thermosetting resin composition will proceed resulting in increased viscosity, and the connection reliability may be reduced. If the heating time is shorter than 10 seconds, the effect of moisture removal may be insufficient and voids may be generated during connection, while if it is longer than 30 minutes, productivity will be lowered. By setting the heat treatment conditions so that the moisture content and residual volatile content are no greater than 1%, it is possible to effectively inhibit creation of voids during connection.

Also, after the thermosetting resin composition has been applied to the board or semiconductor chips and the heat treatment described above performed, it is preferred to maintain a temperature above room temperature for the board or semiconductor chips to which the thermosetting resin composition has been applied, so as to avoid re-absorption of moisture in the air, and more preferably a temperature of 50-60° C. is maintained.

For increased connection reliability, connection between the semiconductor chips and board may be followed by heat treatment with a heating oven or the like, to further promote curing of the thermosetting resin composition.

The apparatus used for connection between the semiconductor chips and board may be a common flip-chip bonder. Also, a flip-chip bonder may be used for the step of alignment of the semiconductor chips and board and temporary anchoring of the semiconductor chips to the board, and the first step and second step may be carried out using a thermocompression bonding apparatus equipped with pressing and heating mechanisms.

There are no particular restrictions on the semiconductor chip, and various types of semiconductors may be used, including element semiconductors of silicon, germanium or the like or compound semiconductors of gallium-arsenic, indium-phosphorus or the like.

The bumps formed on the semiconductor chips may be solder bumps, copper bumps, bumps having structures with solder or tin layers formed on the tips of copper pillars, or gold bumps. The solder used may be Sn-37Pb (melting point: 183° C.), but in consideration of effects on the environment, it is preferred to use lead-free solder such as Sn-3.5Ag (melting point: 221° C.), Sn-2.5Ag-0.5Cu-1Bi (melting point: 214° C.), Sn-0.7Cu (melting point: 227° C.), Sn-3Ag-0.5Cu (melting point: 217° C.), Sn-92Zn (melting point: 198° C.) or the like. For microconnection applications, it is preferred to use copper bumps or bumps having a structure with solder or tin layers formed on the tips of copper pillars.

The board may be an ordinary circuit board, or a semiconductor chip. When a circuit board is used, it may be one having a wiring pattern formed thereon by etching removal of the unwanted portions of a metal layer such as copper formed on an insulating substrate surface made of glass epoxy, polyimide, polyester, ceramic or the like, one having a wiring pattern formed thereon by copper plating on an insulating substrate surface, or one having a wiring pattern formed by printing a conductive substance on an insulating substrate surface.

One type of surface treatment layer selected from among gold layers, solder layers, tin layers and anti-corrosion layers may be formed on the surface of the wiring pattern. A gold layer or tin layer may be formed by electroless or electrolytic plating. A solder layer may be formed by plating, or by a method of coating a solder paste by printing followed by hot melting, or a method of placing fine solder particles on the wiring pattern and hot melting them. An anti-corrosion film layer may be formed by dipping the board in a special chemical solution, also known as pre-flux, thus removing the oxide layer on the wiring pattern surface made of copper or the like while also forming an anti-corrosion layer made of an organic component on the surface, and this is preferred as it can maintain satisfactory wettability for solder or tin and is favorable for microconnection. When the bumps formed on the semiconductor chips are gold bumps, a solder layer or tin layer must be formed in order to form metal bonding sites.

A semiconductor device fabricated using the thermosetting resin composition of the invention will now be described.

FIG. 1 is a schematic cross-sectional view showing an embodiment of a semiconductor device according to the invention. The semiconductor device 10 shown in FIG. 1 comprises a circuit board 7, a semiconductor chip 5, and a sealing resin 6 situated between the circuit board 7 and semiconductor chip 5. The sealing resin 6 is the cured product of a thermosetting resin composition of the invention, and it seals the gap between the circuit board 7 and semiconductor chip 5. The circuit board 7 comprises a board such as an interposer, and wiring 4 formed on one side of the board. The wiring (electrodes) 4 and semiconductor chip 5 of the circuit board 7 are electrically connected by a plurality of bumps 3 formed on the semiconductor chip 5. Also, the circuit board 7 has a side on which the wiring 4 is formed, electrode pads 2 on the opposite side, and solder balls 1 formed on the electrode pads 2, and it is connectable to another circuit member.

The semiconductor device fabricated using a thermosetting composition of the invention may be a CSP (chip-size package) or BGA (ball grid array) having a construction with semiconductor chips mounted on a board known as an interposer, a CoC (chip-on-chip) having a construction with a separate semiconductor chip mounted on a semiconductor chip, or a 3D package having multiple semiconductor chips in a three-dimensional laminated structure via through electrodes.

EXAMPLES

The invention will now be explained by examples and comparative examples, with the understanding that the scope of the invention is not limited thereby.

Examples 1-5 and Comparative Examples 1-3

Using the compositions listed in Table 1, each material was dissolved and mixed in a slurry comprising an inorganic filler dispersed in methyl ethyl ketone (filler concentration: 51 wt %), to a solid concentration of 50-70 wt % to prepare a varnish. After dispersion treatment of the varnish with a bead mill, a knife coater was used for coating onto a separator film (PET film), and this was dried for 10 minutes in an oven at 70° C. to prepare a film-like thermosetting resin composition with a thickness of 25-30 μm.

TABLE 1

| Starting material | Example | | | | | | Comp. Ex. | | |
|---|---|---|---|---|---|---|---|---|---|
| | 1 | 2 | 3 | 4 | 5 | 6 | 1 | 2 | 3 |
| Phenoxy resin | 35 | 35 | 35 | 35 | 35 | 35 | 35 | 35 | 35 |
| Epoxy resin | 40 | 40 | 40 | 40 | 40 | 40 | 40 | 40 | 40 |
| Acid anhydride | 25 | 25 | 25 | 25 | 25 | 25 | 25 | 25 | 25 |
| Flux agent | 3 | 3 | 3 | 3 | 3 | 3 | 3 | 3 | 3 |
| Curing accelerator | 1 | 1 | 1 | 1 | 1 | 1 | 1 | 1 | 1 |
| Inorganic filler 1 | 80 | 60 | 50 | 40 | 30 | — | 100 | — | 50 |
| Inorganic filler 2 | — | — | — | — | — | 30 | — | — | — |
| Inorganic filler 3 | — | — | — | — | — | — | — | — | 50 |
| Inorganic filler 4 | 20 | 40 | 50 | 60 | 70 | 70 | — | 100 | — |
| Coupling agent | — | — | — | — | 0.5 | — | — | — | — |

(Starting materials)
Phenoxy resin: ε-Caprolactone-modified phenoxy resin PKCP80 (product name of Inchem Corporation).
Epoxy resin: Trisphenolmethane-type polyfunctional epoxy resin EP1032H60 (product name of Japan Epoxy Resins Co., Ltd.).
Acid anhydride: Mixture of 3,4-dimethyl-6-(2-methyl-1-propenyl)-4-cyclohexene-1,2-dicarboxylic anhydride and 1-isopropyl-4-methylbicyclo-[2.2.2]oct-5-ene-2,3-dicarboxylic anhydride, YH307 (product name of Japan Epoxy Resins Co., Ltd.).
Flux agent: Adipic acid (product name of Sigma-Aldrich Japan, KK., melting point: 152° C.).
Curing accelerator: Tetra(n-butyl)phosphonium tetraphenylborate PX-4PB (product name of Nippon Chemical Industrial Co., Ltd.)
Inorganic filler 1: Spherical silica SE2050SEE (product name of Admatechs, mean particle size: 0.5 μm, silica having glycidyl groups on the surface)

TABLE 1-continued

| Starting | Example | | | | | | Comp. Ex. | | |
|---|---|---|---|---|---|---|---|---|---|
| material | 1 | 2 | 3 | 4 | 5 | 6 | 1 | 2 | 3 |

Inorganic filler 2: Spherical silica SE2050 (product name of Admatechs, mean particle size: 0.5 μm, non-surface-treated silica)
Inorganic filler 3: Spherical silica SE1050SEE (product name of Admatechs, mean particle size: 0.2 μm, silica having glycidyl groups on the surface)
Inorganic filler 4: Spherical nanosilica ADMANANO (product name of Admatechs, mean particle size: 50 nm, silica having phenyl groups on the surface)
Coupling agent: 3-Glycidoxypropyltrimethoxysilane SH6040 (product name of Toray/Dow Corning/Silicone)

(Viscosity Measurement)

The viscosity was measured in the following manner according to formula (1) and formula (2), based on the parallel-plate plastometer method.

The film-like thermosetting resin composition punched into a circular form with a diameter of 6 mm was attached to a 15 mm-square (0.7 mm-thick) glass plate, and after releasing the separator film, an oxide layer-attached silicon chip (size: 12 mm square, thickness: 0.55 mm) was situated with the oxide layer side in contact with the film-like thermosetting resin composition. This was placed in an FCB3 flip-chip bonder (product name of Panasonic Factory Solutions Co., Ltd.) and thermocompression bonded under conditions with a head temperature of 290° C., a stage temperature of 50° C., a load of 14N and a pressing time of 5 s (to 250° C.). Since the relationship of formula (2) applies if a constant resin volume is assumed, the post-pressing radius was measured with a microscope and the viscosity at 250° C. was calculated according to formula (1).

[Formula 1]

$$\eta = \frac{8\pi F t Z^4 Z_0^4}{3V^2(Z_0^4 - Z^4)} \quad \text{formula (1)}$$

η: Viscosity (Pa·s)
F: Load (N)
t: Pressing time (s)
Z: Post-pressing resin thickness (m)
$Z_0$: Pre-pressing resin thickness (m)
V: Resin volume (m³)

$$Z/Z_0 = (r_0/r)^2 \quad \text{formula (2)}$$

$Z_0$: Pre-pressing resin thickness
Z: Post-pressing resin thickness
$r_0$: Pre-pressing resin radius (Punched to 6 mm diameter, hence 3 mm).
r: Post-pressing resin radius (Gelation Time Measuring Method)

The film-like thermosetting resin composition from which the separator had been released was placed on a hot plate at 250° C., and the time until stirring with a spatula was no longer possible was recorded as the gelation time.

(Measurement of Mean Linear Expansion Coefficient)

The film-like thermosetting resin composition was heat treated at 175° C. for 2 hours, the obtained cured product was cut out to a size of 3 mm width and 40 mm length, and a TMA/SS6000 (product name) by Seiko Instruments, Inc. was used for measurement under conditions with a chuck distance of 20 mm, a measuring temperature range of 0-300° C., a temperature-elevating rate of 5° C./min and a tensile pull of 0.5 MPa on the film cross-sectional area, to determine the mean linear expansion coefficient at the glass transition temperature.

(Adhesive Force Measurement Method)

The film-like thermosetting resin composition punched out to a 5 mm square was attached to the oxide layer-formed side of a 5 mm-square oxide layer-bearing silicon chip (thickness: 550 μm) and the separator film was released, after which the chip was placed on a 12 mm-square silicon chip (#2000 finished, thickness: 550 μm) with the film-like thermosetting resin composition in contact therewith, and contact bonding was performed for 10 seconds at a pressure of 0.5 MPa and a temperature of 190° C., and then for 10 seconds at a pressure of 0.5 MPa and a temperature of 180° C. After heat treatment for 2 hours in an oven at 175° C., it was allowed to stand for 24 hours in a thermo-hygrostat chamber at 85° C./60% relative humidity. It was then allowed to stand for 20 seconds on a hot plate at 260° C., and the shear strength was measured at a shear speed of 50 μm/sec using a Series 4000 (product name) bond tester by Dagy. The value of the obtained shear strength divided by the bonding area of 25 mm² was calculated as the adhesive force.

(Light Transmittance Measuring Method)

There were prepared a film-like thermosetting resin composition with a thickness of 30 μm formed on a separator, and a separator alone, and each was cut to a size of 30 mm×30 mm, after which the film-like thermosetting resin composition formed on the separator was set on the sample mounter of a U-3310 spectrophotometer by Hitachi High-Technologies Corp. while the separator alone was set on the reference mounter, the light transmittance was measured in a wavelength range of 400-800 nm at a scan speed of 300 nm/min, and the light transmittance at 555 nm was read off.

(Semiconductor Chip and Board Connection Method 1)

A JTEG PHASE11_80 by Hitachi VLSI Systems Co., Ltd. (size: 7.3 mm×7.3 mm, bump pitch: 80 μm, bump count: 328, thickness: 0.15 mm, trade name) was prepared as a semiconductor chip on which were formed bumps each having a structure with a lead-free solder layer (Sn-3.5Ag: melting point=221° C.) on a copper pillar tip, and a glass epoxy board having on the surface a copper wiring pattern with an anti-corrosion layer formed thereon by pre-flux treatment was prepared as a board. Next, the film-like thermosetting resin composition was cut to 8 mm×8 mm and attached onto the region of the board where the semiconductor chip was mounted, under conditions of 80° C./0.5 MPa/5 sec, and the separator film was released. The film-like thermosetting resin composition-attached board was held by vacuum chucking onto the stage of an FCB3 flip-chip bonder (product name of Panasonic Factory Solutions Co., Ltd.) set to 40° C. and aligned with the semiconductor chip, and then contact bonding was performed for 5 seconds at a load of 25N and a head temperature of 100° C., (actual temp. between chip and board reaches to 90° C.) as a temporary anchoring step for temporary anchoring of the semiconductor chip onto the board. Next, as a first step, the head temperature of the flip-chip bonder was set to 220° C. and contact bonding was performed for 10 seconds at a load of 25-40N (actual temp. between chip and board reaches to 190° C.). Next, as a second step, the head temperature of the flip-chip bonder was set to 290° C. and contact bonding was performed for 10 seconds at a load of 25-40N (actual temp. between chip and board reaches to 250° C.).

Figure 2:
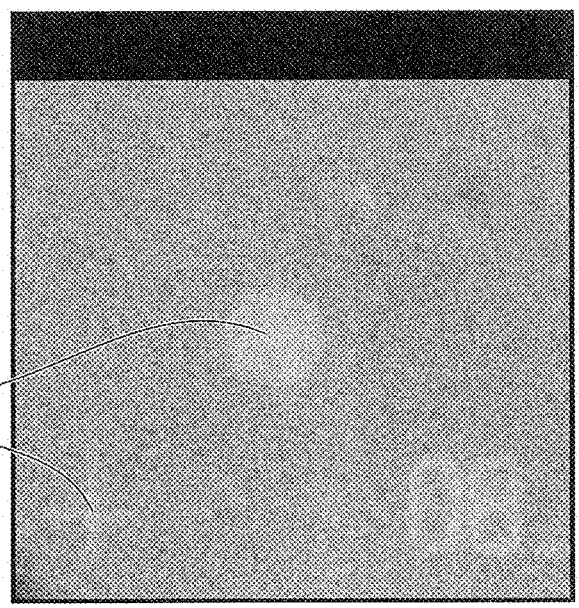
FIG. 2 is a photograph showing the results of attaching the thermosetting resin composition of Example 5 onto a semiconductor chip, and observing an alignment mark formed on the semiconductor chip surface, using the identification camera of a flip-chip bonder.

FIG. 2 shows a photograph of the results of attaching the film-like thermosetting resin composition of Example 5 onto a semiconductor chip and observing an alignment mark formed on the semiconductor chip surface, using the recognition camera of a flip-chip bonder. The symbol A in the photograph denotes the alignment mark.

(Semiconductor Chip and Board Connection Method 2)

A JTEG PHASE11_80 by Hitachi VLSI Systems Co., Ltd. (size: 7.3 mm×7.3 mm, bump pitch: 80 μm, bump count: 328, thickness: 0.15 mm, trade name) was prepared as a semiconductor chip on which were formed bumps each having a structure with a lead-free solder layer (Sn-3.5Ag: melting point=221° C.) on a copper pillar tip, and a glass epoxy board having on the surface a copper wiring pattern with an anti-corrosion layer formed thereon by pre-flux treatment was prepared as a board. After attaching the film-like thermosetting resin composition in contact with the bump-formed side using a hot roll laminator heated to 80° C., it was situated with the side of the semiconductor wafer opposite the bump-formed side attached to dicing tape, and the semiconductor wafer was anchored to a wafer ring. After releasing the separator film of the film-like thermosetting resin composition, a blade dicing apparatus was used for individuation into 7.3 mm×7.3 mm semiconductor chips, to fabricate semiconductor chips having the film-like thermosetting resin composition attached to the bump-formed sides. The glass epoxy board was placed on the stage of an FCB3 flip-chip bonder (product name of Panasonic Factory Solutions Co., Ltd.) set to 40° C. and was aligned with the film-like thermosetting resin composition-attached semiconductor chips, and then contact bonding was performed for 1 second at a load of 25N and a head temperature of 100° C., (actual temp. between chip and board reaches to 90° C.) as a temporary anchoring step for temporary anchoring of the semiconductor chips onto the board. Next, as a first step, the head temperature of the flip-chip bonder was set to 220° C. and contact bonding was performed for 10 seconds at a load of 25-40N (actual temp. between chip and board reaches to 190° C.). Next, as a second step, the head temperature of the flip-chip bonder was set to 290° C. and contact bonding was performed for 10 seconds at a load of 25-40N (actual temp. between chip and board reaches to 250° C.).

(Electrical Test)

The semiconductor device in which the semiconductor chip and board were connected was evaluated as either "acceptable" (+) if daisy chain connection of 328 bumps could be confirmed, or "unacceptable" (×) if daisy chain connection could not be confirmed.

(Evaluation of Voids)

The semiconductor device in which the semiconductor chip and board were connected was observed using an ultrasonic inspection device (FineSAT by Hitachi Construction Machinery Co., Ltd.), and was evaluated as either "acceptable" (+) if the area of voids in the chip area was no greater than 1%, or (×) "unacceptable" if it was less than 1%.

(Evaluation of Joint Condition)

The joint in the semiconductor device in which the semiconductor chip and board were connected was exposed by cross-sectional polishing, and observed using an optical microscope. An evaluation of "acceptable" (+) was assigned if no trapping was seen in the joint and the solder had sufficiently wetted the wiring, while otherwise an evaluation of "unacceptable" (×) was assigned.

Figure 3:
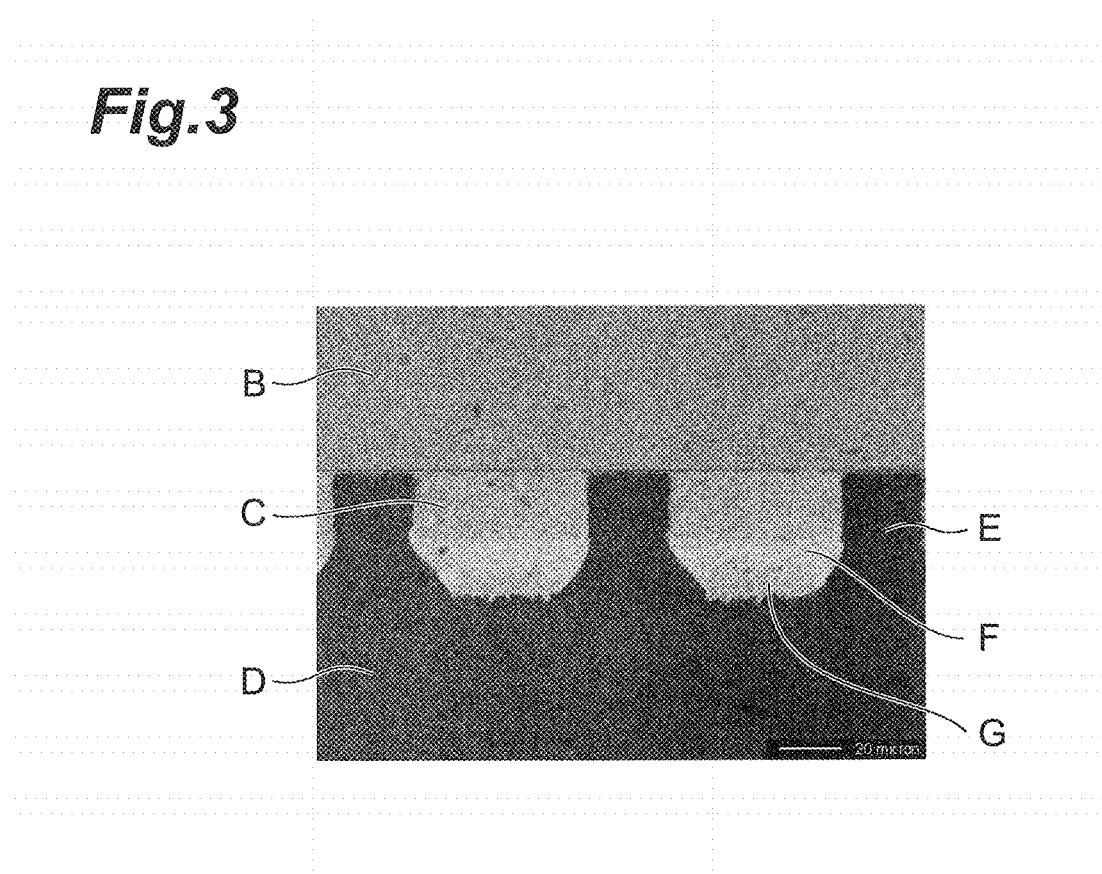
FIG. 3 is a cross-sectional view of the connected state of a semiconductor device formed using the thermosetting resin composition of Example 5.
Figure 4:
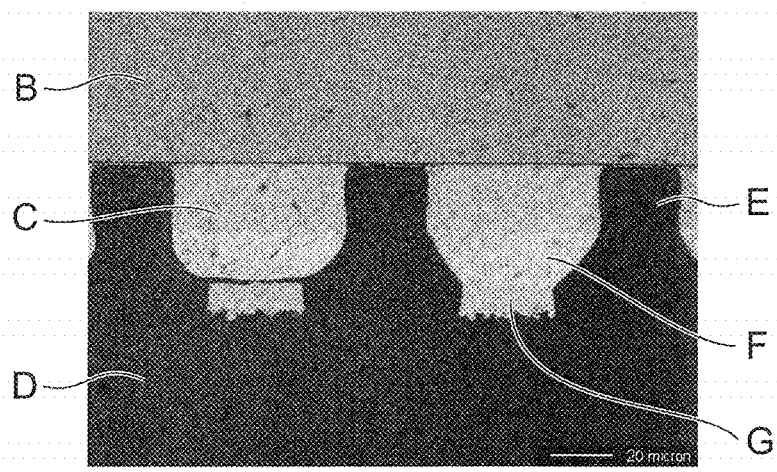
FIG. 4 is a cross-sectional view of the connected state of a semiconductor device formed using the thermosetting resin composition of Comparative Example 2.

FIG. 3 shows a cross-sectional view of the connected state of a semiconductor device fabricated using the film-like thermosetting resin composition of Example 5, and FIG. 4 shows a cross-sectional view of the connected state of a semiconductor device fabricated using the film-like thermosetting resin composition of Comparative Example 2. In the photographs, B denotes the semiconductor chip, C denotes a Cu pillar, D denotes the board, E denotes the thermosetting resin, F denotes lead-free solder and G denotes a board electrode.

Table 2 shows the results of evaluation for Examples 1-6 and Comparative Examples 1-3.

TABLE 2

| Evaluated property | Example | | | | | | Comp. Ex. | | |
|---|---|---|---|---|---|---|---|---|---|
| | 1 | 2 | 3 | 4 | 5 | 6 | 1 | 2 | 3 |
| Viscosity at 250° C. (Pa · s) | 4 | 12 | 23 | 35 | 49 | 57 | 3 | 130 | 15 |
| Gelation time at 250° C. (s) | 6 | 5 | 7 | 7 | 8 | 8 | 5 | 5 | 6 |
| Adhesive force (MPa) | 4.2 | 4.2 | 3.8 | 5.7 | 8.5 | >10 | 0.9 | 8.8 | 1.3 |
| Mean linear expansion coefficient (×10$^{-6}$/° C.) | 46 | 48 | 45 | 45 | 45 | 45 | 39 | 44 | 40 |
| Light transmittance (%) | 3 | 6 | 13 | 18 | 25 | 25 | 2 | 65 | 4 |
| Connection method | 1  2 | 1  2 | 1  2 | 1  2 | 1  2 | 1  2 | 1  2 | 1  2 | 1  2 |
| Voids | +  + | +  + | +  + | +  + | +  + | +  + | +  − | +  + | +  − |
| Conduction test | +  + | +  + | +  + | +  + | +  + | +  + | +  × | ×   | +  + |
| Connection state | +  + | +  + | +  + | +  + | +  + | +  + | +  × | ×   | +  + |

*)In Comparative Example 1 and Comparative Example 3, sample production was not possible using connection method 2

In Examples 1-6, which comprised two silica fillers with different mean particle sizes, one a silica filler with a mean particle size of 0.5 μm and the other a silica filler with a mean particle size of 50 nm, the high temperature adhesive force was greater than in Comparative Example 1 which comprised only a silica filler with a mean particle size of 0.5 μm or in Comparative Example 3 which comprised silica fillers with mean particle sizes of 0.5 μm and 0.2 μm. Also, the mean linear expansion coefficients in Examples 1-6 were not significantly different from those of Examples 1-3, and low mean linear expansion coefficients were exhibited. In addition, light transmittance of 10% or greater was exhibited in Examples 3-6 and it was possible to produce samples in the wafer process, whereas the light transmittance was low in Comparative Examples 1 and 3, preventing visibility of the dicing pattern or alignment marks and preventing sample production. In Comparative Example 2 which comprised a silica filler with a mean particle size of 50 nm, high optical transparency was exhibited and the adhesive force was increased, but the 250° C. viscosity was high and joint defects occurred.

As explained above, the thermosetting resin compositions of the examples allow high adhesive force to be realized at high temperature, and they are suitable for wafer processes.

EXPLANATION OF SYMBOLS

1: Solder ball, 2: electrode pad, 3: bump, 4: wiring, 5: semiconductor chip, 6: sealing resin, 7: circuit board, 10: semiconductor device.

What is claimed is:

1. A thermosetting resin composition for an underfilling of a semiconductor comprising, as essential components, a thermosetting resin, a curing agent, a flux agent and two or more inorganic fillers with different mean particle sizes, wherein the inorganic fillers include an inorganic filler with a mean particle size of no greater than 100 nm and an inorganic filler with a mean particle size of greater than 150 nm and no greater than 500 nm; wherein:
    said thermosetting resin and said flux agent are separate ingredients,
    said thermosetting resin composition is in the form of a film,
    said thermosetting resin contains an epoxy resin which is solid at 25° C.
    wherein the inorganic filler with a mean particle size of no greater than 100 nm is surface-treated, and
    wherein the inorganic filler with a mean particle size of greater than 150 nm and no greater than 500 nm is non-surface-treated.

2. A thermosetting resin composition for an underfilling of a semiconductor according to claim 1, wherein the viscosity at 250° C. is no greater than 100 Pa·s.

3. A thermosetting resin composition for an underfilling of a semiconductor according to claim 1, which has a transmittance of at least 10% for light with a wavelength of 555 nm.

4. A semiconductor device produced using a thermosetting resin composition for an underfilling of a semiconductor according to claim 1.

5. The thermosetting resin composition for an underfilling of a semiconductor according to claim 1, wherein the content of the inorganic filler with a mean particle size of no greater than 100 nm is 10-90 wt % of the total inorganic filler.

6. The thermosetting resin composition for an underfilling of a semiconductor according to claim 1, wherein the inorganic fillers are selected from the group consisting of silica, alumina, mullite, silicon and titanium complex oxide, and boron nitride.

7. The thermosetting resin composition for an underfilling of a semiconductor according to claim 1, wherein the flux agent is selected from the group consisting of alcohols, phenols and carboxylic acids.

* * * * *